(12) United States Patent
Sanae et al.

(10) Patent No.: US 9,345,176 B2
(45) Date of Patent: May 17, 2016

(54) POWER SUPPLY DEVICE HAVING HEAT CONDUCTIVE MEMBER

(71) Applicant: TDK CORPORATION, Tokyo (JP)

(72) Inventors: Haruhiko Sanae, Tokyo (JP); Masaki Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 217 days.

(21) Appl. No.: 13/945,485

(22) Filed: Jul. 18, 2013

(65) Prior Publication Data
US 2014/0029324 A1 Jan. 30, 2014

(30) Foreign Application Priority Data

Jul. 27, 2012 (JP) ................................ 2012-167233

(51) Int. Cl.
*H02M 7/10* (2006.01)
*H05K 7/20* (2006.01)

(52) U.S. Cl.
CPC ..................................... *H05K 7/209* (2013.01)

(58) Field of Classification Search
CPC ...... H02M 7/003; H02M 7/10; H01L 23/473; H01L 25/03
USPC .................................. 363/140–142, 144–147
See application file for complete search history.

(56) References Cited

U.S. PATENT DOCUMENTS

| 6,862,195 B2* | 3/2005 | Jitaru ............................... 363/17 |
| 8,077,003 B2 | 12/2011 | Ikezawa |
| 8,240,411 B2* | 8/2012 | Nakatsu et al. ............ 180/65.21 |
| 2002/0001203 A1* | 1/2002 | Jitaru .............................. 363/17 |

FOREIGN PATENT DOCUMENTS

| CN | 101840765 A | 9/2010 |
| JP | A-9-232488 | 9/1997 |
| JP | 2002-208521 A | 7/2002 |
| JP | 2007-006635 A | 1/2007 |

* cited by examiner

*Primary Examiner* — Yemane Mehari
(74) *Attorney, Agent, or Firm* — Oliff PLC

(57) ABSTRACT

Provided is a power supply device that can suitably release heat with a small number of parts. In an AC-DC converter that is a power supply device according to an embodiment of the present invention, a heat conductive member thermally connected to a base plate is thermally connected to an upper surface of a stacked coil board including a main circuit board and circuit boards. This configuration causes heat generated in the stacked coil board to be transferred to the base plate also from the upper surface of the stacked coil board via the heat conducting member, whereby the heat release effect can be increased. In addition, since the heat conducting member is the only member used for releasing heat, the heat release effect can be increased while the number of parts is kept from increasing.

8 Claims, 11 Drawing Sheets

A POWER SUPPLY DEVICE HAVING HEAT CONDUCTIVE MEMBER

BACKGROUND OF THE INVENTION

1. Field of the Invention

The present invention relates to a power supply device.

2. Related Background Art

Conventionally, various in-vehicle switching power supply devices used in hybrid cars, electric automobiles, or the like have been proposed and supplied for practical use. As a transformer used in these power supply devices, that using a coil board having a winding pattern is known.

Since many heating elements such as the coil board that become high in temperature at the time of operation are provided in a power supply device, various structures for releasing heat from the heating elements have been considered. For example, Japanese Patent Application Laid-Open Publication No. H9-232488 shows a structure in which a heat conducting member and a heat pipe are thermally connected to a board with a heating element mounted thereon on the surface on the opposite side of the mounting surface to release heat therethrough to a heat-releasing member.

SUMMARY OF THE INVENTION

However, since the heat pipe is provided for releasing heat from the upper surface of the heating element in a heat release structure described in Japanese Patent Application Laid-Open Publication No. H9-232488, there is a possibility that the structure becomes complicated and the cost increases due to an increase in the number of parts. The heat pipe itself is not a member that is resistant with respect to mechanical actions, and it is difficult to apply the heat release structure to other configurations.

The present invention has been made in view of the above, and it is an object to provide a power supply device that can suitably release heat with a small number of parts.

In order to achieve the object described above, a power supply device according to one aspect of the present invention includes a stacked coil board including a plurality of coil boards stacked in a thickness direction, a base plate having a main surface on which the stacked coil board is placed and having a heat releasing function, and a heat conducting member is thermally connected to an upper surface of the stacked coil board opposite to the base plate side and including a heat conductive region is thermally connected to the base plate.

With the power supply device described above, the heat conducting member thermally connected to the base plate is thermally connected to the upper surface of the stacked coil board. This configuration causes heat generated at the stacked coil board to be transferred to the base plate also from upper surface of the stacked coil board via the heat conducting member, whereby the heat release effect can be increased. The heat conducting member is the only member used for releasing heat, and the heat release effect can be increased while the number of parts is kept from increasing.

According to another aspect, the heat conducting member is thermally connected to a side surface of the stacked coil board.

With this aspect, in which the side surface of the stacked coil board and the heat conducting member are thermally connected as described above, the heat release effect can be increased further.

According to another aspect, a magnetic core that is inserted at approximately a center portion of a circuit pattern formed on the stacked coil board to form a magnetic path is further provided, and the heat conducting member is thermally connected to the magnetic core on the upper surface side of the stacked coil board.

With this aspect, in which the thermal connection is provided to the magnetic core as described above, heat release can be performed effectively also from the magnetic core.

According to another aspect, the magnetic core is covered by the heat conducting member on the upper surface side of the stacked coil board.

According to another aspect, a heat conductive resin is interposed between the stacked coil board and the heat conducting member.

By providing the heat conductive resin between the stacked coil board and the heat conducting member, damage or the like due to impact of the heat conducting member and the coil board can be avoided with the flexibility of the resin.

According to another aspect, a plurality of stacked coil boards are placed on the base plate, and the heat conducting member is thermally connected to the stacked coil boards.

In the case where there are a plurality of stacked coil boards placed on the base plate in this manner and heat release therefrom is performed by one heat conducting member in the provided configuration, a configuration that increases the heat release effect can be achieved with one heat conducting member, and the heat release effect can be increased without increasing the number of parts.

According to another aspect, the heat conducting member includes the heat conductive region at the center thereof when seen from the thickness direction.

By providing the heat conductive region in the center of the heat conducting member, it becomes possible to perform heat release to the base plate from the heat conducting member more efficiently compared to a case where the heat conductive region is provided in an end portion of the heat conducting member.

With the present invention, a power supply device in which heat release is performed suitably with a small number of parts is provided.

DESCRIPTION OF THE PREFERRED EMBODIMENTS

An embodiment for carrying out the present invention will be described below in detail with reference to the accompanying drawings. Note that, in describing the drawings, the same components are denoted by the same reference signs, and redundant descriptions are omitted. FIGS. 1 to 10 show an X-axis, a Y-axis, and a Z-axis, except for FIG. 2, which is a circuit diagram.

Figure 1:
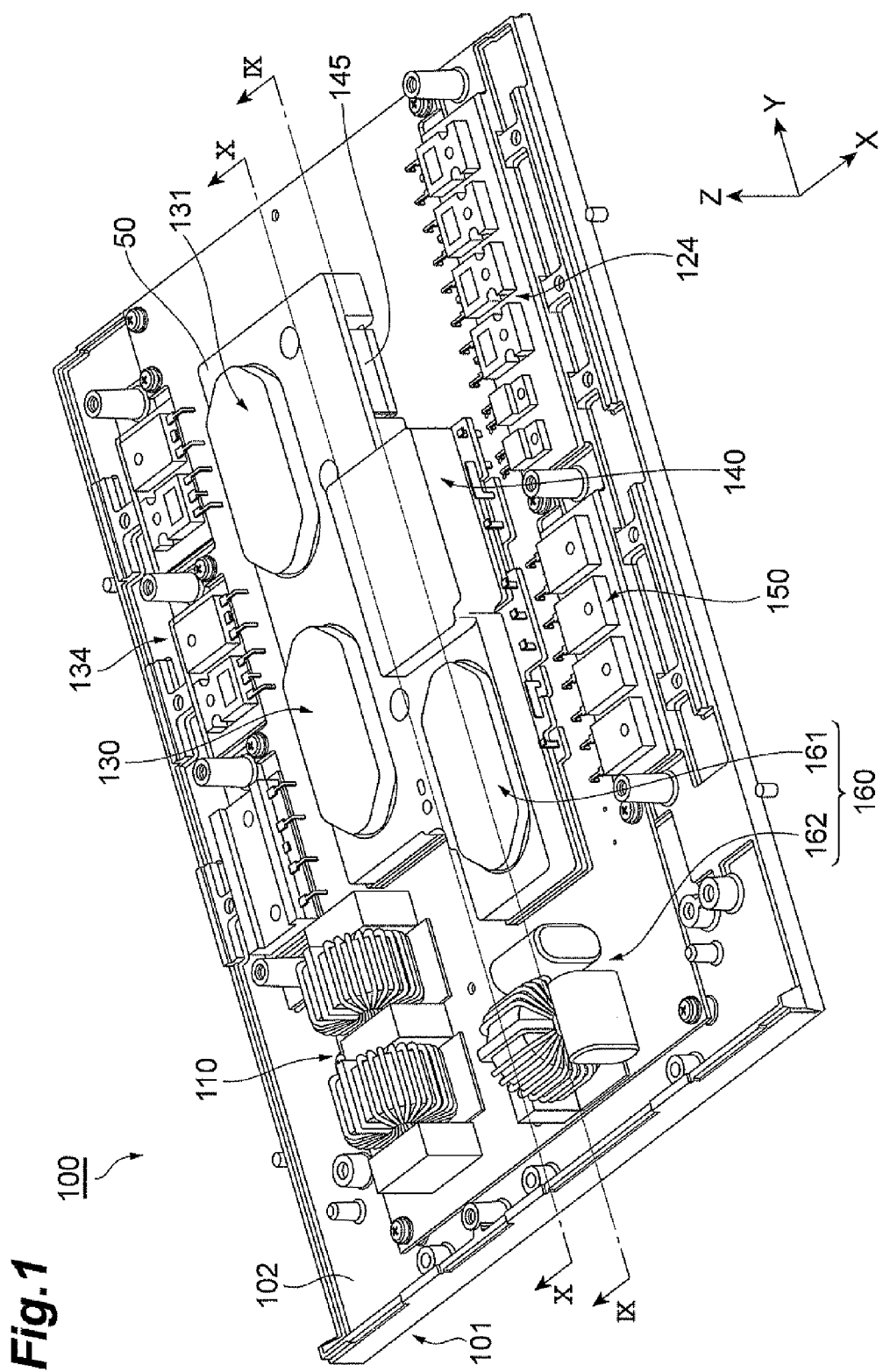
FIG. 1 is a perspective view illustrating the schematic configuration of an AC-DC converter that is a power supply device according to this embodiment.
Figure 2:
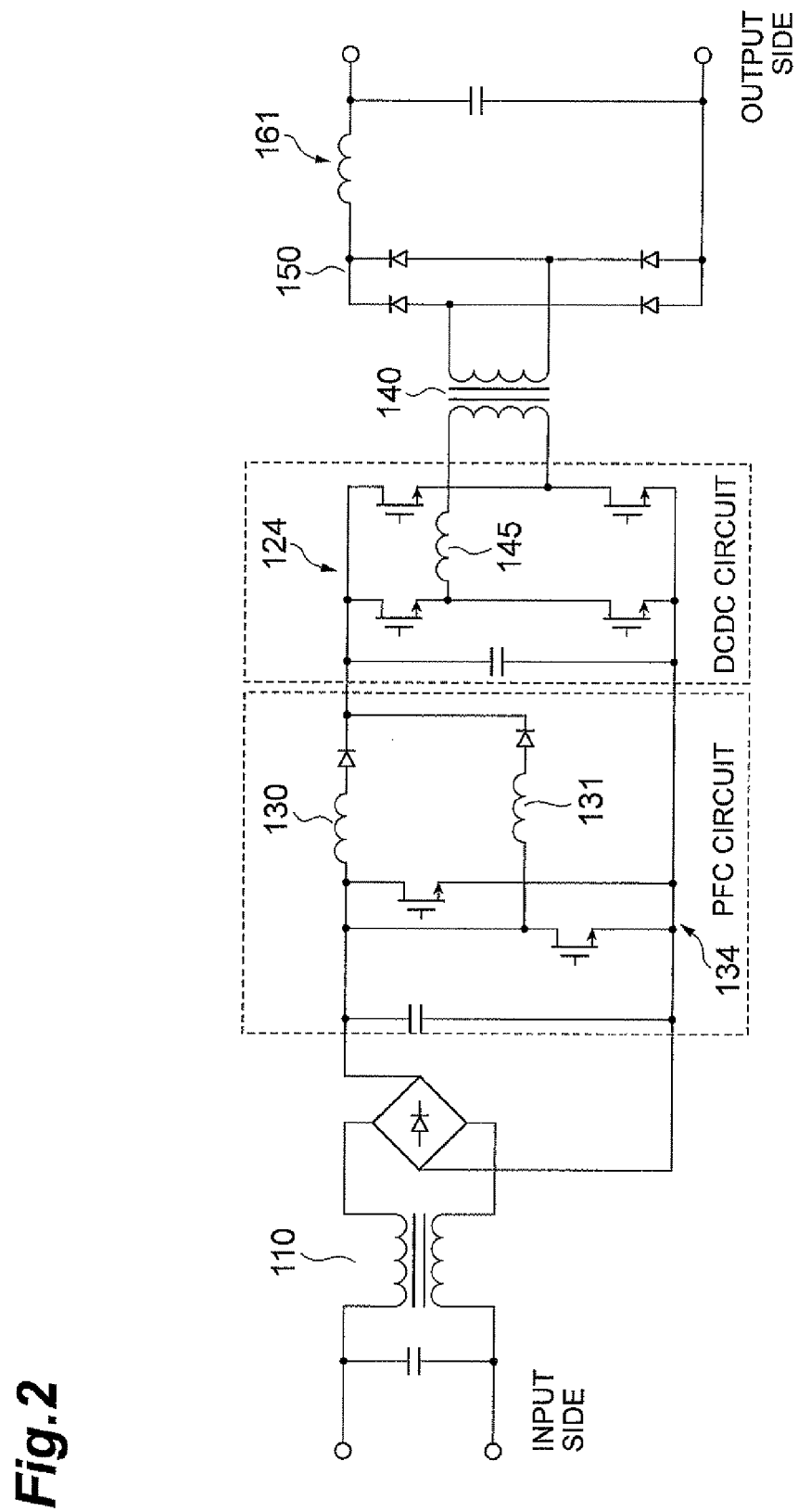
FIG. 2 is a view illustrating the circuit configuration of the AC-DC converter in FIG. 1.

FIG. 1 is a perspective view illustrating the schematic configuration of an AC-DC converter that is a power supply device according to this embodiment. FIG. 2 is a view illustrating the circuit configuration of the AC-DC converter in FIG. 1. An AC-DC converter 100 according to this embodiment has a function by which a voltage Vin of, for example, approximately 85 V to 270 V AC is converted to and output as a direct current output voltage Vout that is supplied externally to a high-voltage battery or the like.

In the AC-DC converter 100, as shown in FIG. 1, an input smoothing circuit (input filter) 110, a DC-DC switching circuit 124, power factor correction circuit choke coils 130 and 131, a power factor correction switching circuit 134 (power factor correction or PFC), a transformer 140, a resonance choke coil 145, a rectifier circuit 150, and a smoothing circuit 160 including an output choke coil 161 and an output smoothing circuit (output filter) 162 are each fixed to a base plate 102 forming the bottom surface of a housing 101.

The housing 101 forms a part of a metal case in which components of the AC-DC converter 100 are accommodated. The AC-DC converter 100 is covered with a cover after electrical parts described above are accommodated inside the housing 101. Each component is attached on the base plate 102 forming the bottom surface of the housing 101. The housing 101 is formed of metal such as aluminum, and a heat release fin is attached to the back surface side (lower side in FIG. 1, i.e., the surface side opposite to the surface to which an element or board is fixed) of the base plate 102. By the heat release fin being air-cooled and the back surface side of the base plate 102 being cooled, heat generated in each element of the AC-DC converter 100 that is fixed on the front surface side of the base plate 102 is transferred to the base plate 102 and released externally from the back surface side of the base plate 102. In this manner, the base plate 102 functions as a heat sink having a heat releasing function. Note that the base plate 102 and the heat release fin may be formed of members different from each other as described above or may be formed of the same component. The configuration in which the heat release fin for air cooling is attached can be replaced with another configuration in which a coolant flow path for water cooling is provided on the back surface side of the base plate 102, whereby heat is released externally from the back surface side of the base plate 102 by water-cooling the back surface side of the base plate 102.

Next, a coil part 10 forming the AC-DC converter 100 shown in FIG. 1 will be described.

Figure 3:
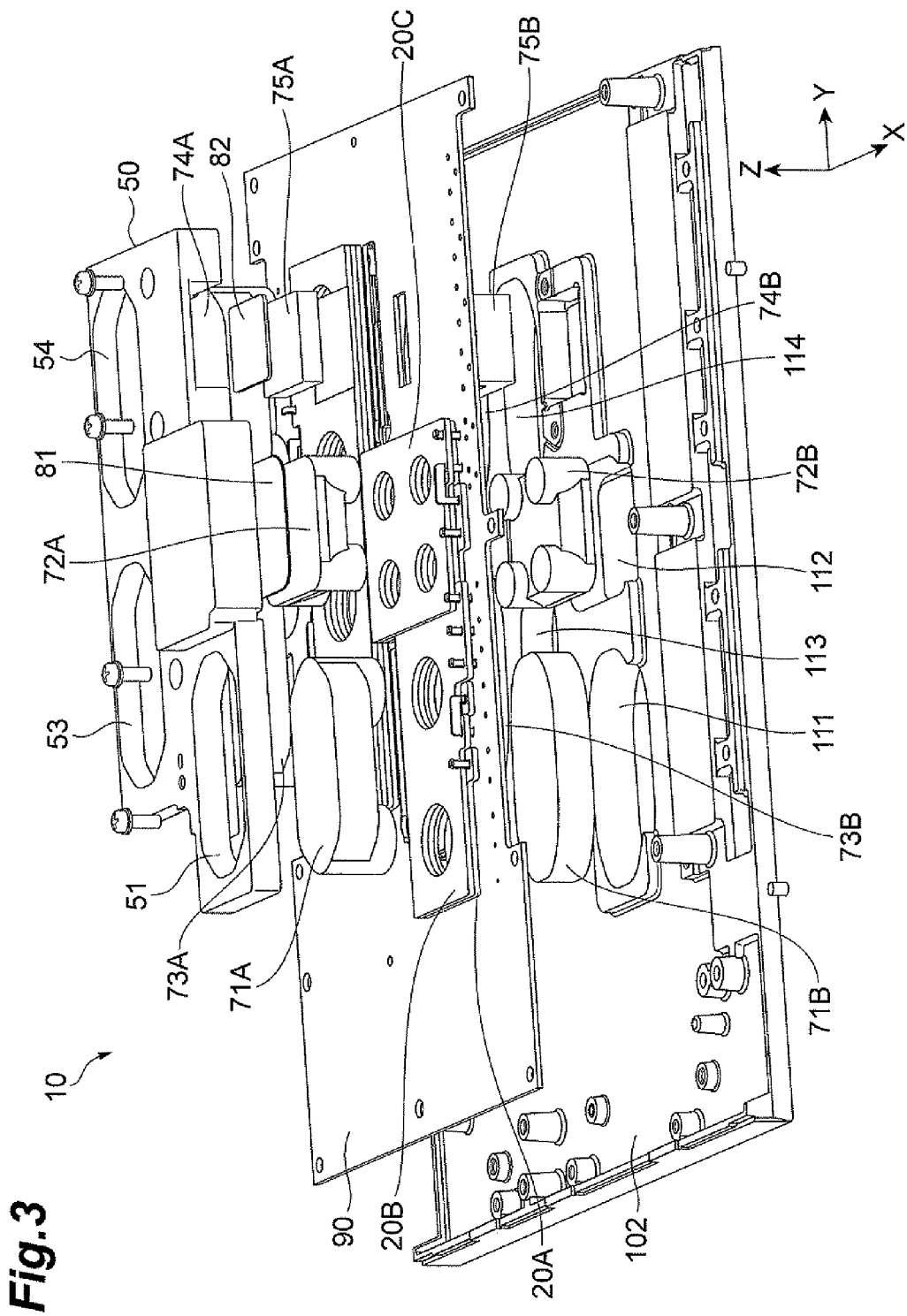
FIG. 3 is an exploded perspective view showing the structure of a coil part forming the AC-DC converter in FIG. 1.
Figure 4:
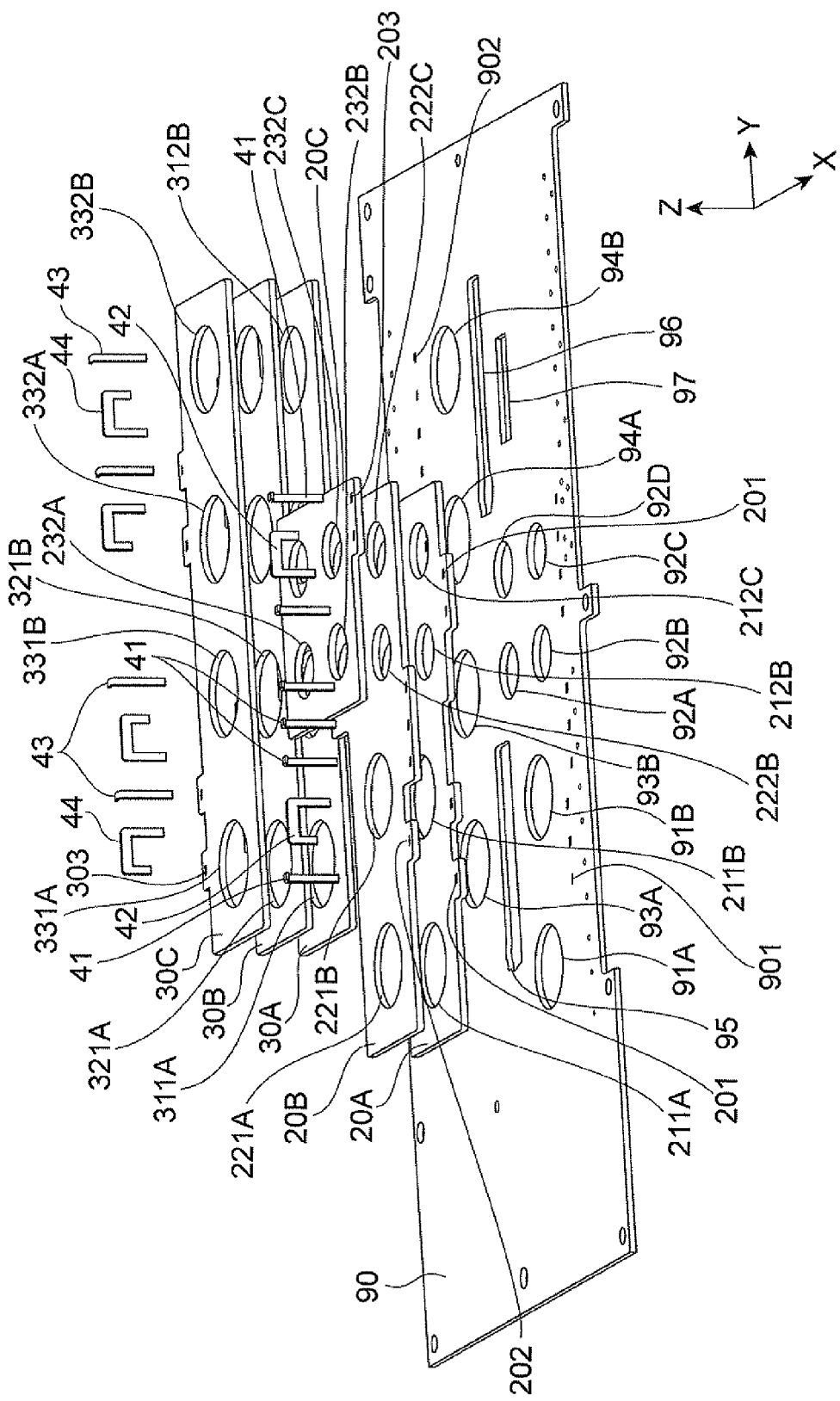
FIG. 4 is an exploded perspective view illustrating the structure of a main circuit board, a coil board, and a plurality of connecting members included in a coil part 10.
Figure 5:
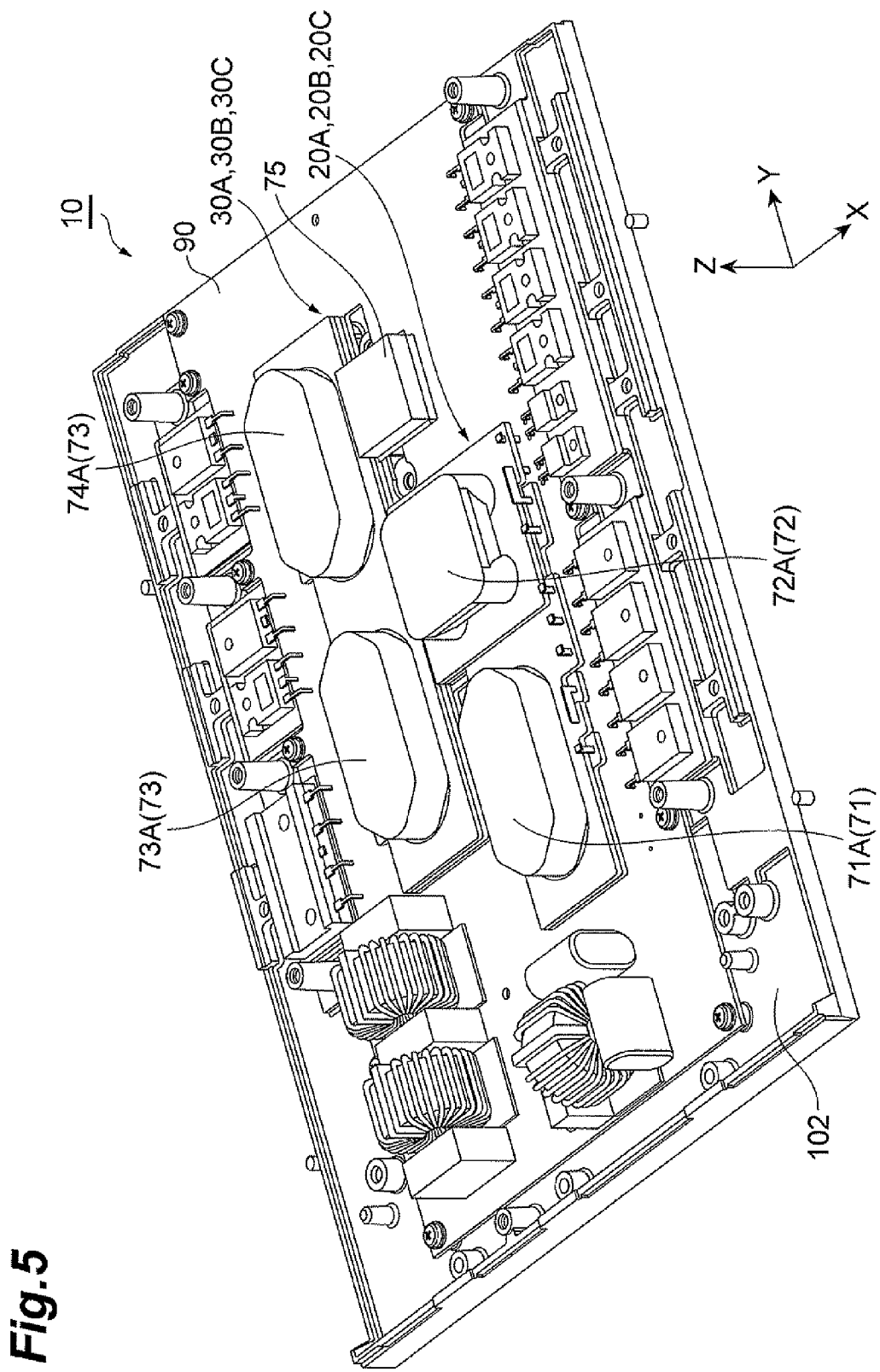
FIG. 5 is a perspective view illustrating the configuration in which components for the coil part shown in FIG. 3 and FIG. 4 are stacked.

FIG. 3 is an exploded perspective view showing the structure of the coil part 10 forming the AC-DC converter 100 in FIG. 1. FIG. 4 is an exploded perspective view illustrating the structure of a main circuit board 90, coil boards 20A to 20C and 30A to 30C and connecting members for connection thereof included in the coil part 10. FIG. 5 is a perspective view illustrating the configuration in which components for the coil part 10 shown in FIG. 3 and FIG. 4 are stacked.

As shown in FIGS. 3 to 5, the coil part 10 includes the main circuit board 90, the three coil boards 20A to 20C stacked on the main circuit board 90, a first magnetic core 71, and a second magnetic core 72, and these function as the output choke coil 161 and the transformer 140 of the AC-DC converter 100 shown in FIG. 1. As shown in FIGS. 4 and 5, the coil part 10 includes the three coil boards 30A to 30C stacked on the main circuit board 90 in a different position from the coil boards 20A to 20C, a third magnetic core 73, and a fourth magnetic core 74, and these function as the power factor correction circuit choke coils 130 and 131 of the AC-DC converter 100 shown in FIG. 1. Furthermore, the coil part 10 is provided with a fifth magnetic core 75 that functions as the resonance choke coil 145. A coil circuit pattern of the resonance choke coil 145 is wound on the main circuit board 90.

The main circuit board 90 is formed by forming a circuit pattern formed of a conductor on front and back surfaces of a base plate formed of an insulating material such as resin and further covering the circuit pattern with an insulating material such as resin. The conductor of the circuit pattern is connected to an electrical part, such as a semiconductor element connected to the main circuit board 90, to form a power supply circuit in the AC-DC converter 100.

The first magnetic core 71, the third magnetic core 73, and the fourth magnetic core 74 each have a configuration in which a U-shaped core (71A, 73A, and 74A) arranged along the Y-axis direction and including two leg portions and a flat 1-shaped core (71B, 73B, and 74B) extending along the Y-axis direction are opposed to each other. The second magnetic core 72 has a configuration in which two four-legged cores 72A and 72B including four leg portions are arranged to oppose each other. The fifth magnetic core 75 is formed of an 1-shaped core 75A in an upper portion and a U-shaped core 75B in a lower portion. Each core is inserted at approximately a center portion of the board provided with a coil circuit pattern and forms a magnetic path.

The main circuit board 90 is provided with two through holes 91A and 91B for inserting the leg portion of the U-shaped core 71A of the first magnetic core 71, four through holes 92A to 92D for inserting the leg portion of the two four-legged cores 72A and 72B forming the second magnetic core 72, two through holes 93A and 93B for inserting the leg portion of the U-shaped core 73A of the third magnetic core 73, and two through holes 94A and 94B for inserting the leg portion of the U-shaped core 74A of the fourth magnetic core 74. The circuit pattern is formed around these through holes. Further, the main circuit board 90 is provided with through holes 95 and 96 that extend in the Y-axis direction for causing contact of a heat conducting member 50 and the base plate 102 described below. Details will be described below The through hole 96 functions as a through hole for inserting one of the leg portions of the U-shaped core 75B including two leg portions that extend upward in the fifth magnetic core 75. The other leg portion of the U-shaped core 75B is inserted to a through hole 97 that is further provided to the main circuit board 90.

The coil boards 20A to 20C and 30A to 30C are approximately flat-shaped boards of which the longitudinal direction is in the Y-axis direction. These have a coil and conductor wiring formed of metal such as copper that are embedded inside a board formed of an insulating member such as resin having electrical insulation properties and are prepared by alternately stacking each of the insulating member and a conductor for the coil and conductor wiring. The coil boards 20A to 20C are stacked on the main circuit board 90 in a state where the three are stacked. In a similar manner, the coil boards 30A to 30C are stacked on the main circuit board 90 in a different position from the coil boards 20A to 20C in a state where the three are stacked. That is, the main circuit board 90 and the coil boards 20A to 20C are stacked in the thickness direction thereby to form a first stacked coil board. The main circuit board 90 and the coil boards 30A to 30C are stacked in the thickness direction thereby to form a second stacked coil board. A thermal compound having heat releasing properties is applied between boards forming the stacked coil board, such as between the main circuit board 90 and the coil board 20A, between the coil board 20A and the coil board 20B, and between the coil board 20B and the coil board 20C. Accordingly, heat transfer is performed suitably between the adjacent boards.

Of the coil boards 20A to 20C, the coil board 20A includes two through holes 211A and 211B for inserting the leg portions of the U-shaped core 71A of the first magnetic core 71 and four through holes 212A to 212D for inserting the leg portions of the two cores 72A and 72B forming the second magnetic core 72. The coil board 20B includes two through holes 221A and 221B for inserting the leg portion of the U-shaped core 71A of the first magnetic core 71 and four through holes 222A to 222D for inserting the leg portion of the two cores 72A and 72B forming the second magnetic core 72. The coil board 20C is stacked on an upper part of the coil board 20B only on the periphery side (right side in FIGS. 3 to 5) of the second magnetic core 72 and includes four through holes 232A to 232D for inserting the leg portion of the two cores 72A and 72B forming the second magnetic core 72. In the coil boards 20A to 20C, the circuit pattern is formed around the through hole provided to each for inserting the leg portion of the core.

That is, in the coil part 10 according to this embodiment, the three boards of the main circuit board 90 and the coil boards 20A and 20B are stacked around the first magnetic core 71, and these form the output choke circuit choke coil 161. The four boards of the main circuit board 90 and the coil boards 20A, 20B, and 20C are stacked around the second magnetic core 72, and these form the transformer 140. Note that, since the number of layers to be stacked varies depending on the configuration of the circuit, the configuration described above is not limiting.

The configuration is such that the main circuit board 90 and the coil boards 20A to 20C are respectively provided with through holes 901, 201, 202, and 203 for circuit connection and the conductor layer in each board is exposed inside the corresponding through hole. A plurality of I-shaped terminals 41 or U-shaped terminals 42 formed of metal are inserted to the respective through holes of the respective boards. Accordingly, the conductor layer in the main circuit board 90 and the conductor layers in the coil boards 20A to 20C are electrically connected via the I-shaped terminal 41 and the U-shaped terminal 42.

Regarding the coil boards 30A to 30C, the three boards are stacked on the main circuit board 90 in that order from the bottom. The coil board 30A includes two through holes 311A and 311B for inserting the leg portion of the U-shaped core 73A of the third magnetic core 73 and two through holes 312A and 312B for inserting the leg portion of the U-shaped core 74A of the fourth magnetic core 74. The coil board 30B includes two through holes 321A and 321B for inserting the leg portion of the U-shaped core 73A of the third magnetic core 73 and two through holes 322A and 322B for inserting the leg portion of the two cores 74A and 74B forming the fourth magnetic core 74. The coil board 30C includes two through holes 331A and 331B for inserting the leg portion of the U-shaped core 73A of the third magnetic core 73 and two through holes 332A and 332B for inserting the leg portion of the two cores 74A and 74B forming the fourth magnetic core 74. In the coil boards 30A to 30C, the circuit pattern is formed around the through hole provided to each for inserting the leg portion of the core.

That is, in the coil part 10 according to this embodiment, the three boards of the main circuit board 90 and the coil boards 30A, 30B, and 30C are stacked around the first magnetic core 73 and the fourth magnetic core 74, and these form the power factor correction circuit choke coils 130 and 131.

The configuration is such that the main circuit board 90 and the coil boards 30A to 30C are respectively provided with through holes 902 and 303 for circuit connection and the conductor in each board is exposed inside the corresponding through hole (the through hole provided to the coil board 30A and 30B is not shown in FIG. 4, but has a configuration similar to that of the through holes 201, 202, and 203 provided to the coil board 20A to 20C). A plurality of I-shaped terminals 43 or U-shaped terminals 44 formed of metal are inserted to the respective through holes of the respective boards. Accordingly, the conductor in the main circuit board 90 and the conductor layers in the coil boards 30A to 30C are electrically connected via the 1-shaped terminal 43 and the U-shaped terminal 44.

Next, returning to FIG. 3, the shape of the base plate 102 will be described. The base plate 102 forming the bottom surface of the housing 101 is provided with depressions and protrusions corresponding to the shape of the coil part 10. Specifically, while the main circuit board 90 is attached to come into contact with the base plate 102, a depressed portion 111 corresponding to the shape of the I-shaped core 71B is provided in a position where the I-shaped core 71B arranged in the lower part of the first magnetic core 71 is to be arranged. Accordingly, the coil part 10 is placed on the base plate 102 such that the bottom surface and the side surface of the I-shaped core 71B each contact the depressed portion 111. In a similar manner, a depressed portion 112 corresponding to the shape of the core 72B is also provided in a position where the core 72B arranged in the lower part of the second magnetic core 72 is to be arranged. Accordingly, the coil part 10 is attached to the base plate 102 such that the bottom surface of the core 72B of the second magnetic core 72 contacts the depressed portion 112.

Furthermore, a depressed portion 113 corresponding to the shape of the I-shaped core 73B is provided in a position where the I-shaped core 73B arranged in the lower part of the third magnetic core 73 is to be arranged. Accordingly, the coil part 10 is attached to the base plate 102 such that the bottom surface and the side surface of the I-shaped core 73B each contact the depressed portion 113. In a similar manner, a depressed portion 114 corresponding to the shape of the I-shaped core 74B is also provided in a position where the I-shaped core 74B arranged in the lower part of the fourth magnetic core 74 is to be arranged. Accordingly, the coil part 10 is attached to the base plate 102 such that the bottom surface of the I-shaped core 74B of the fourth magnetic core 74 contacts the depressed portion 114.

Accordingly, by having the configuration described above, the cores 71B, 72B, 73B, and 74B are fixed to the base plate 102, and heat can be released suitably to the base plate 102 from the cores 71B, 72B, 73B, and 74B. Therefore, the cooling effect by the base plate 102 can be increased.

Figure 6:
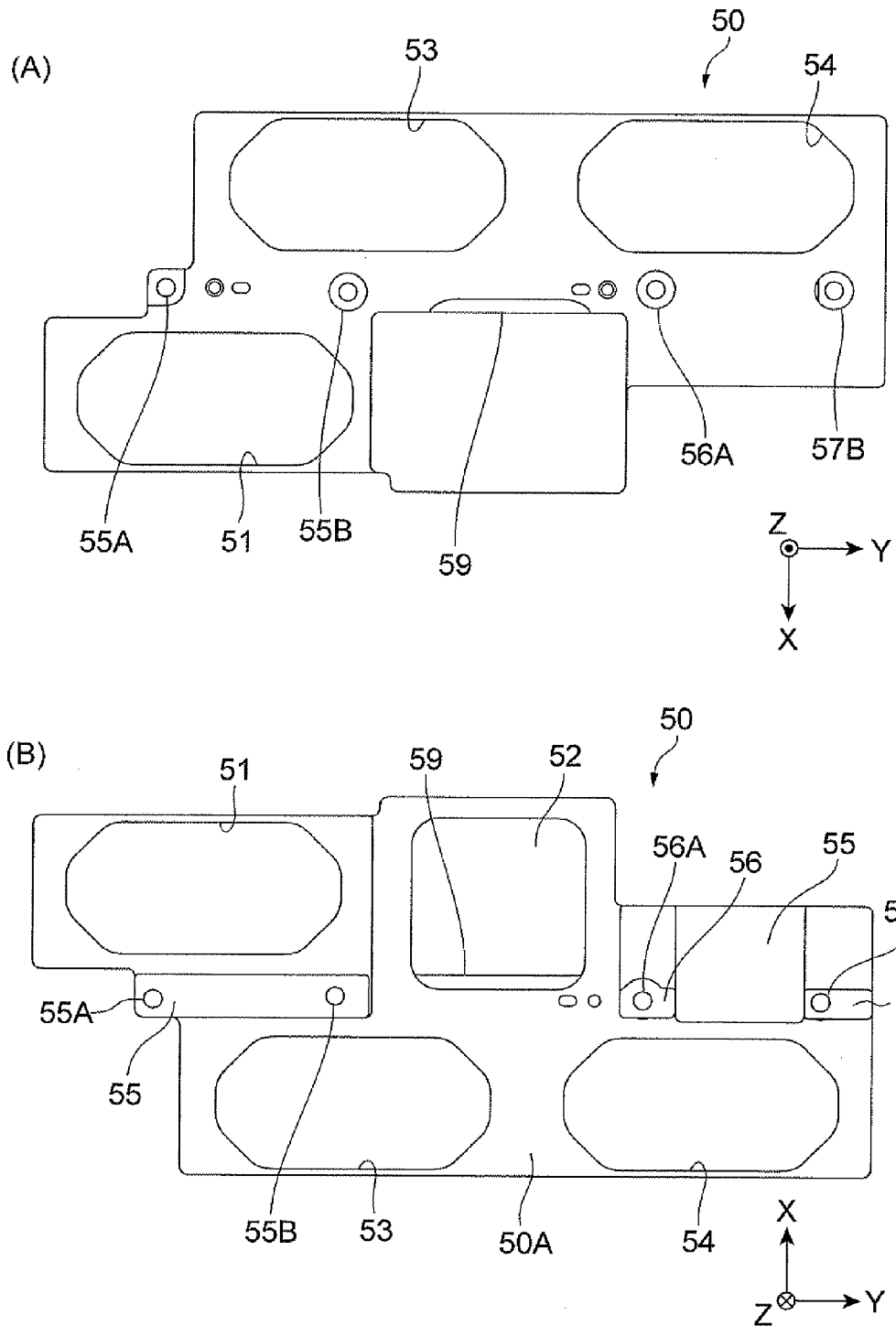
FIGS. 6A and 6B are a plan view and a bottom view, respectively, illustrating the configuration of a heat conducting member.
Figure 7:
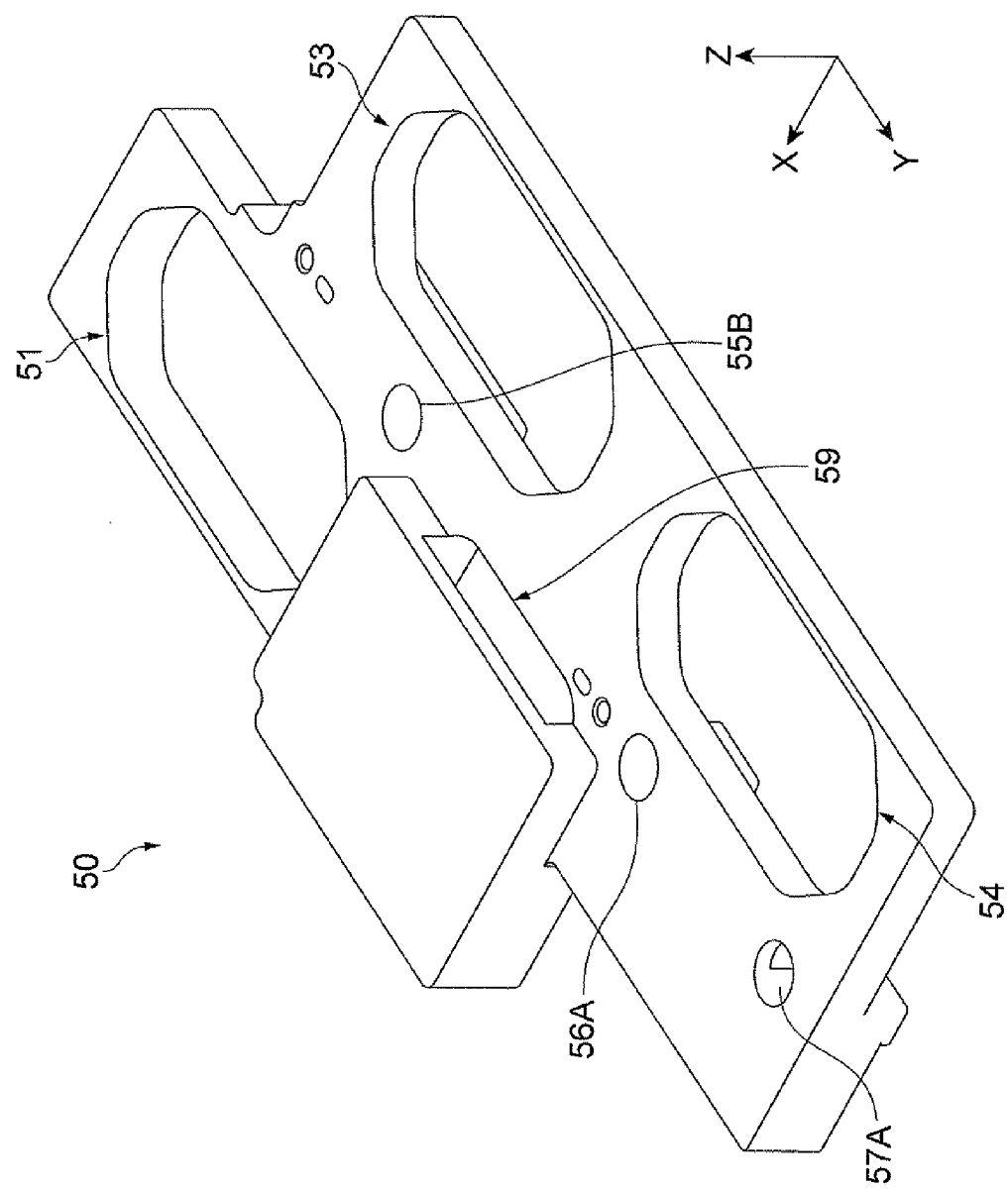
FIG. 7 is a schematic perspective view of the heat conducting member when seen from above.
Figure 8:
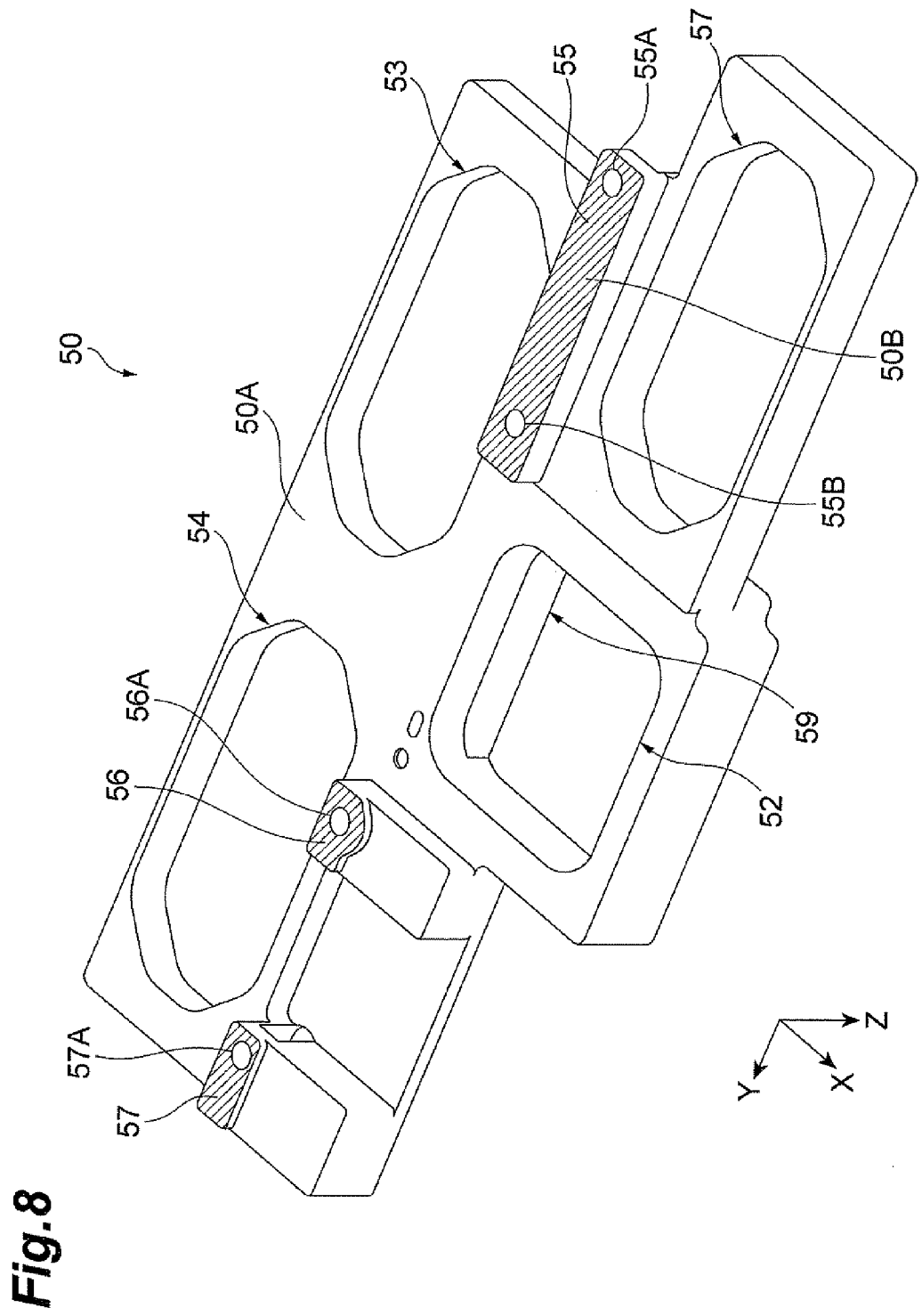
FIG. 8 is a schematic perspective view of the heat conducting member when seen from below.

Next, the heat conducting member 50 provided in an upper portion of the coil part 10 will be described using FIGS. 6A to 8. FIGS. 6A and 6B are a plan view and a bottom view (back view), respectively, illustrating the configuration of a heat conducting member 50. FIG. 7 is a schematic perspective view of the heat conducting member 50 when seen from above, and FIG. 8 is a schematic perspective view of the heat conducting member 50 when seen from below.

The heat conducting member 50 is made of a material having heat conductivity, such as aluminum and copper, and is preferably made of aluminum in consideration of the rigidity. The heat conducting member 50 has an approximately flat shape with a size such that an upper part of the coil boards 20A to 20C and the coil boards 30A to 30C stacked on the main circuit board 90 are covered and is provided to be stacked on the upper part of the coil boards 20A to 20C and the coil boards 30A to 30C. That is, a main surface 50A on the back surface side of the heat conducting member is configured to contact the coil boards 20B and 20C and the coil board 30C.

The heat conducting member 50 is provided with through holes 51, 53, and 54 corresponding to positions where the first magnetic core 71, the third magnetic core 73, and the fourth magnetic core 74 are provided. These through holes 51, 53, and 54 are provided to correspond respectively to the shapes of the first magnetic core 71, the third magnetic core 73, and the fourth magnetic core 74. With respect to an upper portion of the second magnetic core 72, a through hole is not provided, and a depressed portion 52 is formed to cover the top surface of the four-legged core 72A on the upper side of the second magnetic core 72. Note that, upon attaching the heat conducting member 50, a heat release sheet 81 (see FIG. 3) formed of heat conductive resin is provided between the depressed portion 52 and the second magnetic core 72. In a similar manner, with respect to an upper portion of the fifth magnetic core 75, a through hole is not provided, and a depressed portion 55 is formed to cover the top surface of the 1-shaped core 75A on the upper side of the fifth magnetic core 75. Note that, upon attaching the heat conducting member 50, a heat release sheet 82 (see FIG. 3) formed of heat conductive resin is provided between the depressed portion 55 and the fifth magnetic core 75.

Note that the heat release sheet may be configured to be sandwiched in another position. For example, a heat conductive resin may be sandwiched between the coil board 20 and the heat conducting member 50.

On the back surface side of the heat conducting member 50, protruding portions 55 to 57 that protrude downward from the main surface 50A on the back surface side are provided. The protruding portion 55 is provided with two screw holes 55A and 55B along the Y-axis direction. The protruding portion 56 is provided with a screw hole 56A, and the protruding portion 57 is provided with a screw hoe 57A. Regions forming the upper surfaces of these protruding portions, i.e., the regions with shade shown in FIG. 8 are heat conductive regions 50B that come into contact with the base plate 102 when these are mounted on the base plate 102.

Furthermore, on the side surface of the protruding portion 52, an opening 59 is provided. By the opening 59 being provided, whether the four-legged core 72A in the upper portion of the second magnetic core 72 and the heat release sheet 81 are arranged in the appropriate position inside the depressed portion 52 can be determined upon attaching the heat conducting member 50 to the coil part 10.

Figure 9:
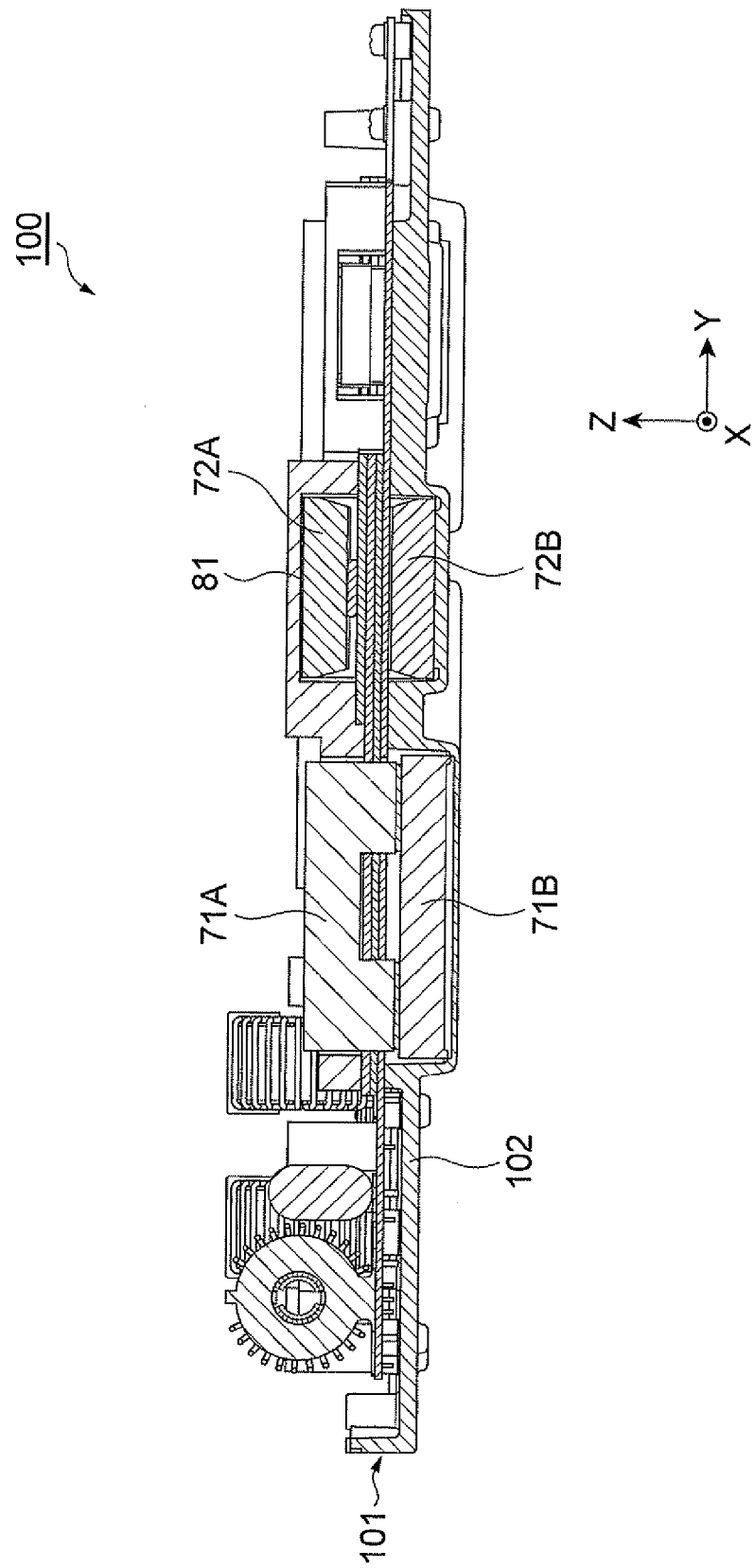
FIG. 9 is an arrow view along line IX-IX in FIG. 1.

A case where the heat conducting member 50 is attached to the coil part 10 described above and these are accommodated in the housing 101 will be described using FIGS. 1, 3, 9, and 10. FIG. 9 is an arrow view along line IX-IX in FIG. 1, and FIG. 10 is an arrow view along line X-X in FIG. 1.

As shown in FIG. 3, the coil boards 20A to 20C and 30A to 30C are stacked on the main circuit board 90, these are then sandwiched by the first magnetic core 71, the second magnetic core 72, the third magnetic core 73, the fourth magnetic core 74, and the fifth magnetic core 75, and then the heat conducting member 50 is placed thereon. At this time, a thermal compound is applied in a position where the main circuit board 90, the coil boards 20A to 20C and 30A to 30C come into contact with the heat conducting member 50. Accordingly, the adhesion of the heat conducting member 50 and the coil board 20 increases, and the heat release effect increases.

Since the heat conducting member 50 is provided with the through holes 51, 53, and 54, the U-shaped core 71A, 73A, and 74A on the upper side of the first magnetic core 71, the third magnetic core 73, and the fourth magnetic core 74 are respectively inserted to the through holes 51, 53, and 54. The upper surface of the second magnetic core 72 is come into contact with the depressed portion 52 of the heat conducting member 50 with the heat release sheet 81 therebetween. The upper surface of the fifth magnetic core 75 is come into contact with the depressed portion 55 of the heat conducting member 50 with the heat release sheet 82 therebetween. The second magnetic core 72 and the circuit wound therearound function as the transformer 140, and the fifth magnetic core 75 and the circuit wound therearound function as the resonance choke coil 145. The amount of heat generation by these coils is greater than in other coils and results in high temperature. Thus, by providing the heat conducting member 50 to cover the upper surface of the core, the heat transfer area increases, and the heat release effect is increased further.

Figure 10:
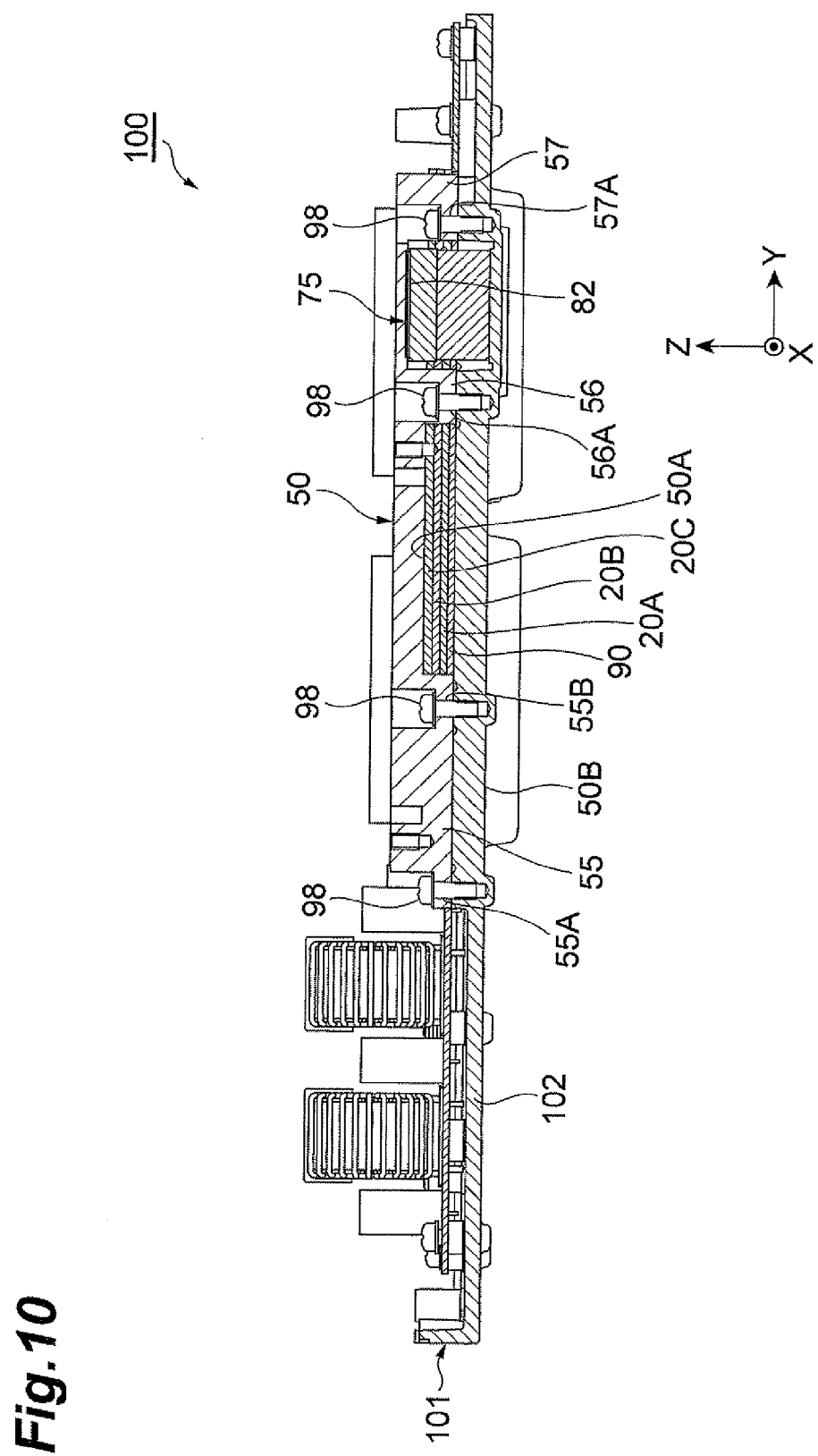
FIG. 10 is an arrow view along line X-X in FIG. 1.

As shown in FIG. 9 and FIG. 10, the bottom surface (lower surface) 50A of the heat conducting member 50 comes into contact with the upper surface of the stacked coil board (i.e., the upper surface of one of the coil boards 20B, 20C, and 30C). Furthermore, as shown in FIG. 10, the bottom surface (lower surface) 50A of the heat conducting member 50 comes into contact with the side surfaces of the stacked coil boards (i.e., the side surfaces of the main circuit board 90 and the coil boards 20A to 20C).

Furthermore, the protruding portions 55 to 57 of the heat conducting member 50 are configured to be inserted to the through holes 95 and 96 of the main circuit board 90 such that the heat conductive regions 50B on the upper surface of the protruding portions 55 to 57 come into contact with the base plate 102. The heat conducting member 50 is fixed to the base plate 102 with screws 98 being attached to the respective through holes 55A, 55B, 56A, and 57A provided to the protruding portions 55 to 57.

Accordingly, the heat conducting member 50 and the base plate 102 are thermally connected via the heat conductive regions 50B. The heat conducting member 50 is thermally connected to the upper surfaces of the stacked coil boards (i.e., the upper surface of one of the coil boards 20B, 20C, and 30C). Thus, heat generated in the coil boards 20A to 20C and 30A to 30C and the second magnetic core 72 (particularly, the core 72A in the upper part) in contact with the heat conducting member 50 is transferred to the base plate 102 from the heat conducting member 50 via the heat conductive regions 50B. Therefore, compared to a conventional configuration in which heat generated in a part attached on the main circuit board 90 is released only from the back surface side of the base plate 102 in a conventional manner, heat transfer to the base plate 102 can be performed efficiently from the upper and side surfaces of the coil boards or the upper and side surfaces of each core via the heat conducting member 50, and the cooling effect can be increased as a result.

The heat conductive regions 50B formed of the protruding portions 55 to 57 of the heat conducting member 50 are near the center of the heat conducting member 50 when seen from the thickness direction. That is, the arrangement is approximately in the middle of the choke coils 130 and 131, the transformer 140 insulating the primary side and the secondary side, and the choke coil 161 forming a part of a secondary-side rectifier circuit. Accordingly, since heat is transferred to the screws evenly from any wiring part, heat can be released to the base plate 102 via the screws 98 and the heat conductive regions 50B more effectively. Furthermore, compared to a case where the heat conductive regions 50B are formed in an end portion, heat release can be performed effectively from both the circuit boards 20A to 20C and the circuit boards 30A to 30C.

In addition, with the configuration in which the heat conducting member 50 is fixed to the base plate 102 with the screws 98, the heat conducting member 50 can be fixed physically. By fixing the heat conducting member 50 to the base plate 102 with the screws 98, fixation of the main circuit board 90 and the coil boards 20A to 20C and 30A to 30C sandwiched by the heat conducting member 50 and the base plate 102 also becomes possible. The movement of the second magnetic core 72 and the fifth magnetic core 75 of which the top surfaces come into contact with the heat conducting member 50 is restricted, and the movement of the first magnetic core 71, the third magnetic core 73, and the fourth magnetic core 74 is also restricted, particularly in the horizontal direction (X-Y plane direction) since the outer circumference of the core on the upper side is encompassed by the heat conducting member 50.

By taking the structure described above, heat generated at the coil boards 20A to 20C and 30A to 30C is transferred to the base plate 102 from the lower side in the thickness direction as well as to the upper side in the thickness direction simultaneously, and heat can be transmitted to the base plate 102 via the heat conducting member 50. Accordingly, heat generated at the transformer and a choke can be transferred to the base plate 102 effectively, and the cooling effect can be increased.

As described above, the heat conducting member 50 thermally connected to the base plate 102 is thermally connected to the upper surface of the stacked coil board formed of the main circuit board 90 and the coil circuit boards 20A to 20C in the AC-DC converter 100 that is a power supply device according to this embodiment. This configuration causes heat generated in the stacked coil board to be transferred to the base plate 102 also from the upper surface of the stacked coil board via the heat conducting member 50, whereby the heat release effect can be increased. In addition, since the heat conducting member 50 is the only member used for releasing heat, the heat release effect can be increased while the number of parts is kept from increasing.

Since the side surfaces of the stacked coil boards and the heat conducting member 50 are thermally connected, the heat release effect can be increased further. By providing thermal connection to the second magnetic core 72 in the AC-DC converter 100 described above, heat release can be performed effectively also from the magnetic core. In particular, in the case where the heat conducting member 50 acts as a cover as for the second magnetic core 72, the heat releasing properties can be increased since the area of a heat transfer region increases.

In the case where the heat release sheet that is the heat conductive resin is provided between the coil board 20A and the heat conducting member 50 in the provided configuration, damage or the like due to an impact of the heat conducting member and the coil board can be avoided with the flexibility of the resin.

In the case where there are a plurality of stacked coil boards placed on the base plate 102 as in the AC-DC converter 100 according to this embodiment, the configuration in which heat release therefrom is performed by one heat conducting member 50 enables the heat release effect to be increased without increasing the number of parts. Simultaneously, ease of assembly and ease of component management can be achieved because the choke coils 130 and 131 forming a part of the power factor correction circuit, the transformer 140 insulating the primary side and the secondary side, and the choke coil 161 forming a part of the secondary-side rectifier circuit are arranged in approximately the center portion of the main circuit board 90

By providing the heat conductive regions 50B in the center of the heat conducting member 50 when seen from the thickness direction, it is possible to perform heat release to the base plate from the heat conducting member 50 more efficiently compared to a case where the heat conductive regions are provided in the end portion of the heat conducting member 50.

An embodiment for this embodiment has been described above. The power supply device according to this embodiment can be changed as appropriate. For example, although the AC-DC converter has been described as one example of the power supply device in the embodiment described above, it may be applied to a power supply device having other configurations such as a DC-DC converter.

Figure 11:
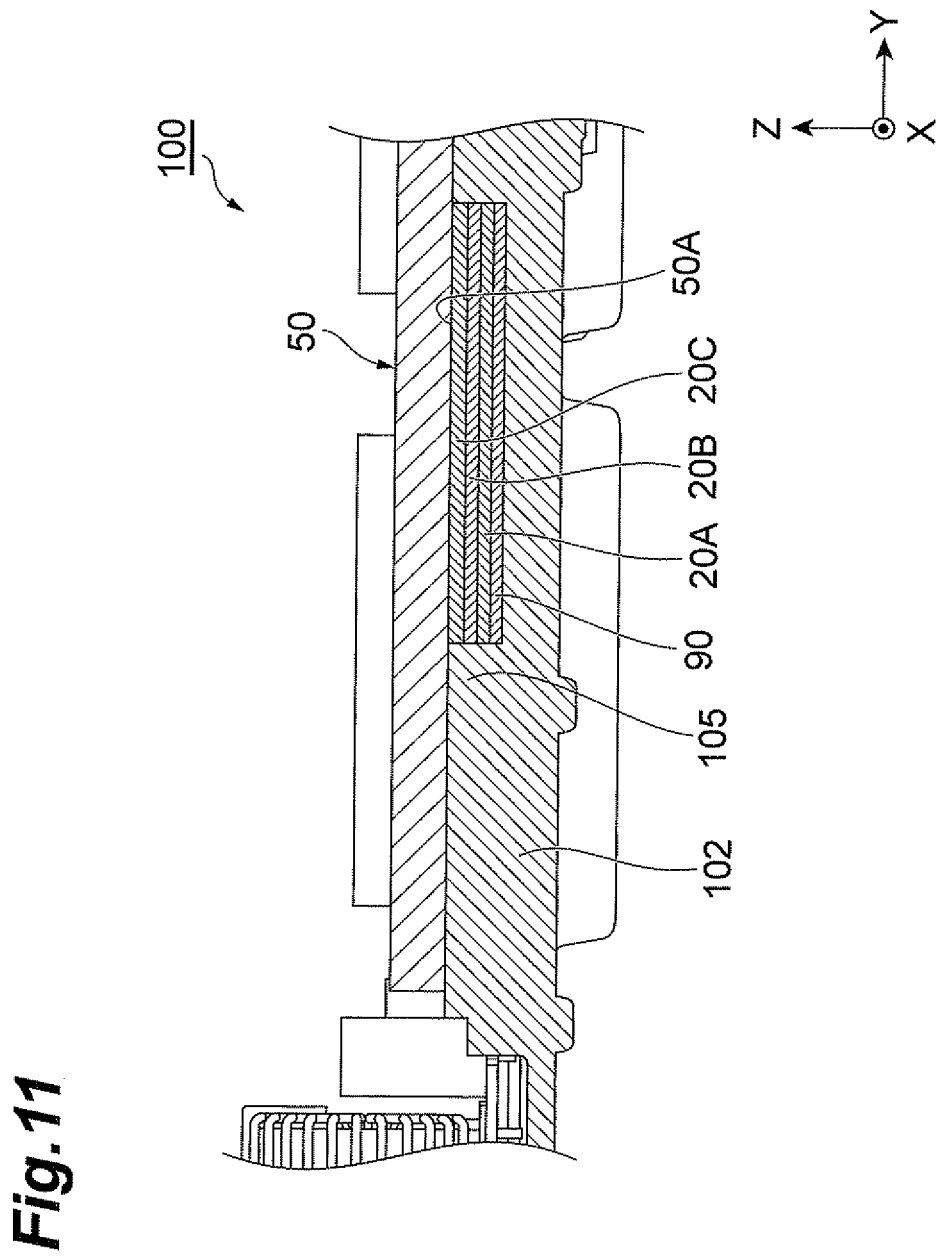
FIG. 11 is a view illustrating a modification example of the power supply device according to this embodiment and corresponds to a partially enlarged view of FIG. 10.

The shapes of the heat conducting member 50 and the base plate 102 can be changed as appropriate. A modification example of a structure in which the heat conducting member 50 and the base plate 102 are in contact will be described using FIG. 11. FIG. 11 is a view illustrating the modification example of the AC-DC converter 100 according to this embodiment and corresponds to a partially enlarged view of FIG. 10. Although the configuration in which the heat conducting member 50 includes the protruding portions 55 to 57 that protrude toward the base plate 102 has been described in the embodiment described above, a protruding portion 105 that protrudes toward the heat conducting member 50 may be formed on the base plate 102 side as in FIG. 11. In this manner, the shape of the heat conducting member 50 and the base plate 102 can be changed as appropriate.

Although direct interference with the heat conducting member 50 is avoided herein regarding the magnetic cores other than the second magnetic core 72, the heat conducting member 50 may come into contact with the cores in a similar manner to the second magnetic core 72 in the case where cooling of the cores is necessary. Furthermore, the structure in which the heat conducting member 50 covers the upper surface of the magnetic core can be replaced with another structure in which the side surfaces of the magnetic cores and the heat conducting member 50 are thermally connected.

What is claimed is:
1. A power supply device comprising:
a stacked coil board including a plurality of coil boards stacked in a thickness direction;
a base plate having a main surface that is perpendicular to the thickness direction and on which the stacked coil board is placed and having a heat releasing function; and
a heat conducting member that is thermally connected to an upper surface of the stacked coil board opposite to and distal from the base plate and including a heat conductive region that is thermally connected to the base plate.
2. The power supply device according to claim 1, wherein the heat conducting member is thermally connected to a side surface of the stacked coil board.
3. The power supply device according to claim 1, further comprising a magnetic core inserted at approximately a cen- ter portion of a circuit pattern formed on the stacked coil board to form a magnetic path, wherein
the heat conducting member is thermally connected to the magnetic core on the upper surface side of the stacked coil board.

4. The power supply device according to claim 3, wherein the magnetic core is covered by the heat conducting member on the upper surface side of the stacked coil board.

5. The power supply device according to claim 1, further comprising a heat conductive resin interposed between the stacked coil board and the heat conducting member.

6. The power supply device according to claim 1, wherein
a plurality of stacked coil boards are placed on the base plate, and
the heat conducting member is thermally connected to the stacked coil boards.

7. The power supply device according to claim 1, wherein the heat conducting member includes the heat conductive region at center thereof when seen from the thickness direction.

8. A power supply device comprising:

a stacked coil board including a plurality of coil boards stacked in a thickness direction;

a base plate having a main surface that is perpendicular to the thickness direction and on which the stacked coil board is placed and having a heat releasing function;

a heat conducting member that is thermally connected to an upper surface of the stacked coil board distal from and opposite to the base plate and including a heat conductive region that is thermally connected to the base plate;

a magnetic core inserted at approximately a center portion of a circuit pattern formed on the stacked coil board to form a magnetic path, wherein the heat conducting member is thermally connected to a side surface of the stacked coil board and the magnetic core on the upper surface side of the stacked coil board.

* * * * *